United States Patent
Risen, Jr. et al.

(10) Patent No.: US 6,294,217 B1
(45) Date of Patent: Sep. 25, 2001

(54) METHODS AND COMPOSITIONS FOR PRODUCING MICROLENSES AND OPTICAL FILTERS

(75) Inventors: William M. Risen, Jr., 87 Miller Ave., Rumford, RI (US) 02916; Yong Zhong Wang, Providence, RI (US)

(73) Assignee: William M. Risen, Jr., Providence, RI (US)

(*) Notice: Subject to any disclaimer, the term of this patent is extended or adjusted under 35 U.S.C. 154(b) by 0 days.

(21) Appl. No.: 09/101,026
(22) PCT Filed: Dec. 19, 1996
(86) PCT No.: PCT/US96/20095
§ 371 Date: Sep. 18, 1998
§ 102(e) Date: Sep. 18, 1998
(87) PCT Pub. No.: WO97/22893
PCT Pub. Date: Jun. 26, 1997

Related U.S. Application Data
(60) Provisional application No. 60/009,001, filed on Dec. 19, 1995.

(51) Int. Cl.[7] .................. B05D 5/06; B05D 3/06
(52) U.S. Cl. ............................ 427/164; 427/226
(58) Field of Search .................. 427/164, 226

(56) References Cited

U.S. PATENT DOCUMENTS

| | | | |
|---|---|---|---|
| 3,737,264 | * | 6/1973 | Nye et al. ............ 425/134 |
| 4,776,868 | * | 10/1988 | Trotter, Jr. et al. ........ 65/17.4 |
| 5,196,041 | * | 3/1993 | Tumminelli et al. ........ 65/386 |
| 5,307,438 | * | 4/1994 | Bilkadi et al. ........... 385/141 |
| 5,498,444 | * | 3/1996 | Hayes ................... 427/162 |

* cited by examiner

Primary Examiner—Shrive P. Beck
Assistant Examiner—Michael Cleveland
(74) Attorney, Agent, or Firm—Fay, Sharpe, Fagan, Minnich & McKee, LLP

(57) ABSTRACT

This invention relates to novel vitreous microlenses and optical filters and methods for their formation. This includes formation of inorganic oxide microlenses and optical filters on other objects, including the production of oxide glasses in various shapes. For example, the present invention is directed to the use of precursor materials such as carboxylated polysiloxanes, including carboxylated polygermanosiloxanes in the hydrogen or fully or partially metal ion exchanged forms to produce the vitreous microlenses and optical filters of the invention.

23 Claims, 5 Drawing Sheets

Schematic diagram of preparation of microlenses from H100PSI and related materials. a) small droplets and b) larger droplets

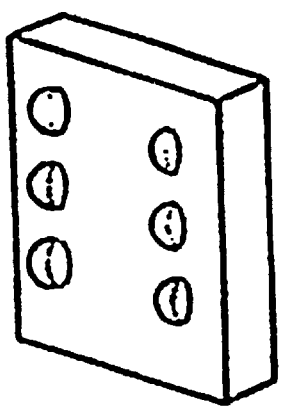
FIGURE 1(a)
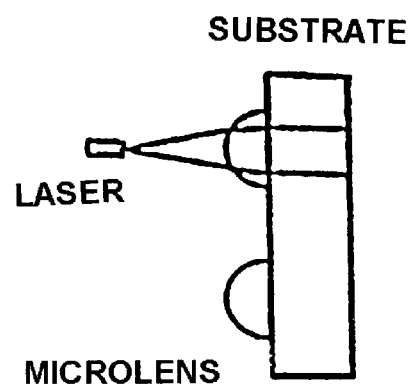
FIGURE 1(b)
FIGURE 1

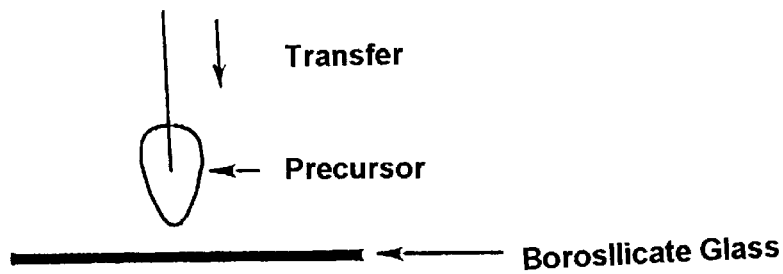
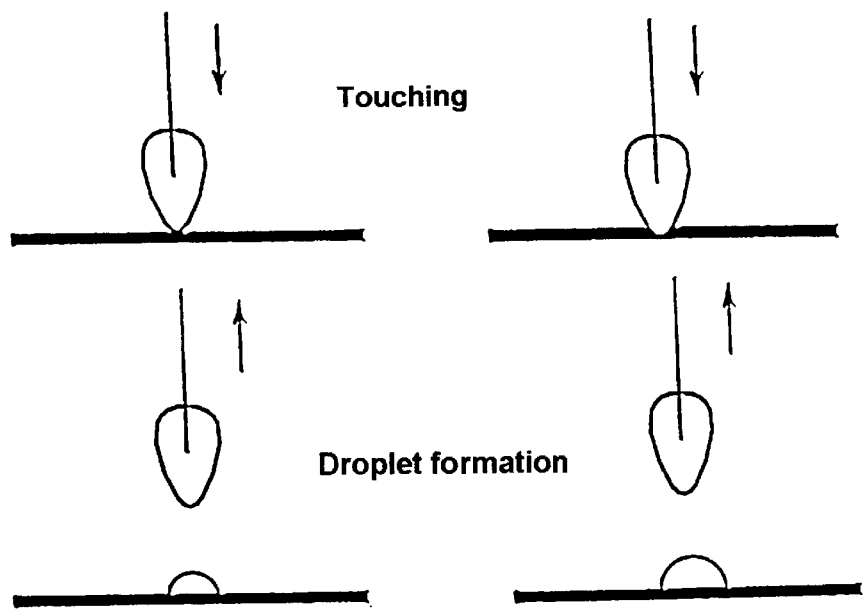
Figure 4(a)          Figure 4(b)
Schematic diagram of preparation of microlenses from H100PSI and related materials. a) small droplets and b) larger droplets
Figure 4

Figure 5(a)   Figure 5(b)   Figure 5(c)
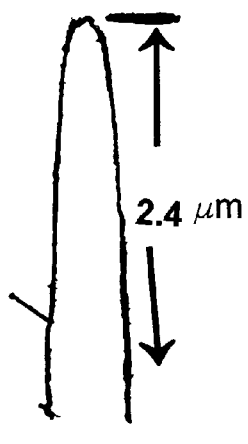
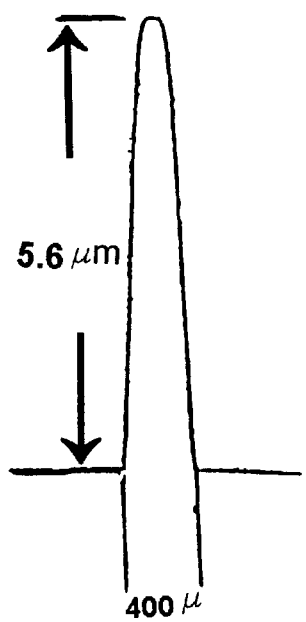
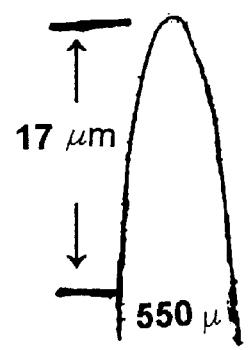
Dektak surface profiles of microlenses: a) from H100PSI; b) from H50PSI; and c) from $Tm^{3+}$ doped H100PSI
Figure 5

US 6,294,217 B1

METHODS AND COMPOSITIONS FOR PRODUCING MICROLENSES AND OPTICAL FILTERS

This application is a 371 of PCT/US96/20095, which was filed on Dec. 19, 1996, which claims priority from Ser. No. 60/009,001, which was filed on Dec. 19, 1995.

This invention was made with government support under Contract No. F-49620-93-1-0049 from the U.S. Air Force Office of Scientific Research. Consequently, the Government may have certain rights in this invention.

FIELD OF THE INVENTION

This invention pertains to the field of optical devices. The invention is particularly applicable to the production of microlenses and optical filters and will be described with particular reference thereto. However, it will be appreciated that the invention has broader applications and may be advantageously employed in other environments and applications.

BACKGROUND OF THE INVENTION

Microlenses are used in a wide range of devices, such as copy machines, optical memory and/or laser disk systems, to focus, collimate or otherwise shape light. They typically range in size from 0.1 to 1 millimeteis (100–1000 $\mu$m), although they can be considerably smaller or larger. Microlenses can be produced as objects on substrates, typically broadly describable as protrusions in the general shape of a dome or spherical segment, or as regions of modified refractive index (gradient indices) within substrates. Such microlenses have been made by a number of methods, including ion exchange, chemical vapor deposition (CVD), electromigration, photolithography or organic photoresist, diffusion polymerization, and various other techniques. Some of these methods are described in *Fundamentals of Microoptics; Distributed-Index Microlens, and Stacked Planar Optics*, by K. Iga, Y. Kohubun and M. Oikawa, OHM, Academic Press Japan, Inc. Tokyo, 1984, US Edn. Academic Press, Orlando, Fla. (ISBN-0-12-370360-3). Among many scientific publications and other disclosures in the field are those referred to in the above cited book as well as others such as the article "Microlenses for Coupling Junction Lasers to Optical Fibers," by L. G. Cohen and M. V. Schneider, *Applied Optics*, 13, pp 89–94, January 1974.

The uses for microlenses include collimating light from a laser diode (LD) or light emitting diode (LED) through a material or into an optical fiber as shown in FIGS. 1 and 2. Other uses for microlenses also include focusing light. These collimating and focussing effects can be used to collimate light or focus light into a waveguide or onto a spot at a distance determined by the shape of the lens and the refractive indices of all elements in the optical path for the light at issue.

The currently available microlenses tend to fall into the three categories: (1) gradient index planar lenses; (2) protruding structures formed of inorganic oxide glasses; and (3) protruding structures formed from materials which deform or decompose at relatively low temperatures, such as thermoplastic or other organic based materials. This invention concerns microlenses of the second type. Recent examples of the second type, protruding structures formed of inorganic oxide glasses, tend to be expensive, difficult to make, and limited in their range of refractive index and selective light absorption (filtering).

In one aspect, the invention relates to a method for producing a microlens on a substrate. The method involves the preparation of a carboxylated silicone precursor composition, application of the precursor composition to the surface of a substrate to form a precursor droplet; and, then the thermal oxidation of the precursor droplet to form a microlens. The substrates include but are not limited to composition of silica, silicates, borosilicate glasses and silicon.

Accordingly, it is an object of the invention to produce microlenscs in novel manner and to achieve controllability of the refractive index of the lenses through the introduction of germanium and various metal ions into the glassy microlenses.

A further object of the invention is to add metal ions to the microlens compositions for selective absorption of light and to achieve filtering properties of the microlenses.

These and other objects and features of the invention will be apparent from the following summary and description of the invention and from the claims.

BRIEF DESCRIPTION OF THE DRAWINGS

The following is a brief description of the drawings, which are presented for the purpose of illustrating the invention and not for the purposes of limiting the same.

FIG. 1 shows schematic views of a microlens array with (a) being a perspective view of such an array with microlenses protruding from the surface of a substrate and (b) being a side view with a curved surface microlens serving to collimate the light from a laser.

FIG. 4 is an illustration of methods for applying liquids to form droplets, wherein the straight line segment protruding from a drop of precursor represents schematically a wire of appropriate gauge and the drop is illustrated independent of the wire gauge or the effect of the surface tension of the liquid or the forces between the liquid and the wire.

FIG. 5 shows Dektak surface profiles of microlenses of this invention.

SUMMARY OF THE INVENTION

Figure 2:
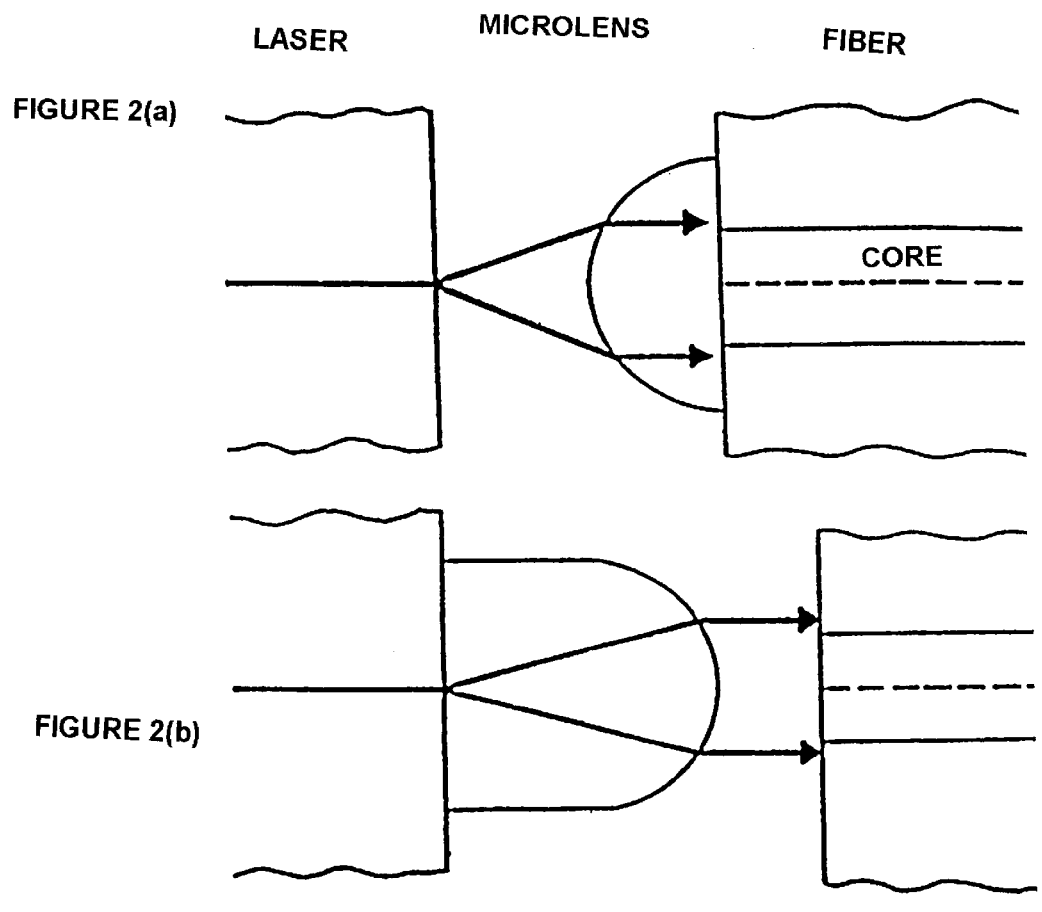
FIG. 2 shows microlens applications in the field of optical waveguides, with (a) showing the microlens on the end of an optical fiber, and (b) showing microlens on a laser.
Figure 3:
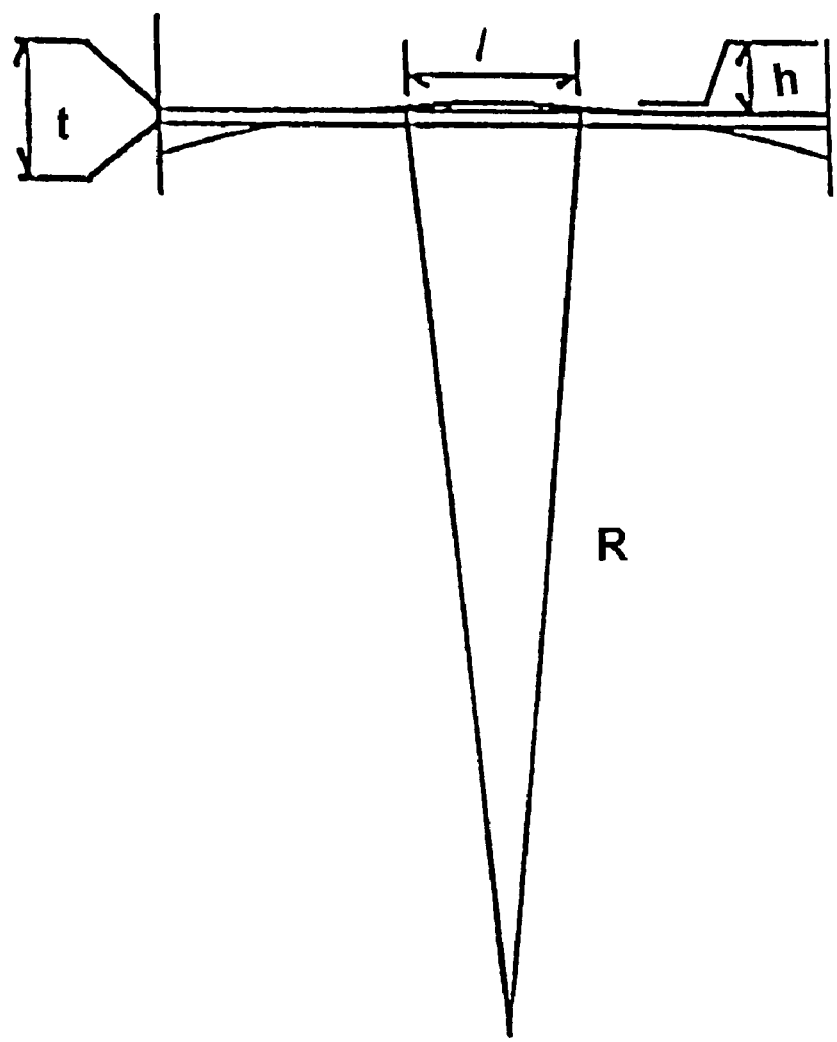
FIG. 3 is a schematic side view of a substrate with a microlens on it, wherein the diameter of the lens is 1, the thickness of the lens is h, the thickness of the substrate is t, and the radius of the sphere of which the lens would be a segment is R.

The present invention is directed to microlenses, material compositions for producing microlenses, methods for preparing the precursor materials and methods for making microlenses. Additionally, the invention relates to microlens arrays and optical filters comprising inorganic oxide glasses as protrusions, generally describable as spherical segments on substrates.

In one aspect, the invention relates to a method for producing a microlens on a substrate. The method involves the preparation of a carboxylated silicone precursor composition, application of the precursor composition to the surface of a substrate to for a precursor droplet; and, then the thermal oxidation of the precursor droplet to form a microlens. The substrates include but are not limited to compositions of silica, silicates, borosilicate glasses, and silicones.

The precurors utilized in the invention are carboxylated polysiloxanes, including carboxylated polygermanosiloxanes, and their wholly or partially metal ion substituted forms. The precursors, which are present in concentrated solutions, are viscous fluids which are used to form micro-droplet precursors. In this regard, a solvent such as ethanol or acetone can be added to the precursors to modify and control their flow and surface tension properties, to faciliate the formation of spherical shape of the precursor on substrates, etc.

The methods for forming the microlenses include placing a precursor "droplet" of a precursor fluid on a substrate and heating it to form a glass microlens. The term "droplet" refers to a quantity of liquid that coalesces into a single globule, with sizes varying according to physical conditions and the properties of the fluid itself. The precursor droplet generally is from about 20 micrometers to 1000 micrometers in diameter and contains about 4 picoliters to about 600 nanoliters in volume.

The droplets can be placed on the substrate by suspending the droplet from a wire (i.e. wire transformation) and touching the fluid to the substrate. Alternatively, droplets can be dropped onto the substrate through the surrounding atmosphere by a technique such as using an ink jet printer.

The term "droplets" also can be applied to material remaining in regions on the substrate as a result of other processes such as photolytic crosslinking. Thus, a region of film of a photo-crosslinkable precursor can be exposed to crosslinking radiation, either photolyzed directly or through the intervention of a photoinitiator, to covert it to a less soluble material than the rest of the film material. The remaining portion of the film material can be removed from the substrate by a process of washing, dissolving, evaporating, or the like. This leaves the crosslinked region as a "droplet."

For example, the present invention also relates to a process of forming a microlens having a desired pattern on a substrate. The process involves the preparation of a carboxylated silicone precursor composition with or without photoinitiator on the surface of a substrate to form a precursor film. The precursor film is then covered with a mask having a desired pattern of spherical shaped droplets. The masked precursor film is subsequently exposed to radiation thereby crosslinking the unmasked precursor film to form a pattern of spherica shaped droplets. The uncross-linked precursor film is removed from the substrate by washing the film with an organic solvent leaving the cross-linked precursor film in the form of a pattern on the substrate. The cross-linked precursor film is then thermally oxidized to form a pattern of droplets on the substrate.

Alternatively, a photolysis of a photoresist operating in the opposite sense could be employed. A further alternative method of spatially resolved photolysis and consequent photocross-linking involves the use of a directed light source, such as a laser beam or directed collimated or focused light in the wavelength range, typically the ultraviolet range, required for photoinitiation of cross-linking. It also can be employed. Regardless of method, one aspect of the invention involves depositing a small "droplet" of precursor material on the substrate to produce a precursor droplet. The substrate is preferably silica or a silicate glass.

As briefly mentioned, the precursor droplet or droplet arrays on a substrate are heated in a furnace in air up to 600° C. to allow the organosilicone droplets be transformed into inorganic glass microlenses by thermal oxidation. Alternative methods of thermal oxidation, such as heating with radiation from a laser in air, may be used.

DETAILED DESCRIPTION OF THE INVENTION

The present invention is directed to novel microlenses and arrays and methods and compositions (including precursors) for forming the same. The precursors are ionically functionalized organosilicones, organogermanosilicones and metal ion forms of these materials. Among the precursor materials, carboxylated polysiloxanes in the forms of carboxylated polygermanosiloxanes are described. The carboxylated polysiloxanes are synthesized according to the following methods.

A. Preparations of Carboxylated Siloxane Precursor Compositions

1. Preparation of poly(carboxypropylmethyl)siloxane (H100PSI)

A sample of 20 mL of 3-cyanopropylmethyldichlorosilane was placed in a round bottom flask and stirred while 4.2 mL of water was added dropwise. The mixture was stirred at room temperature for 4 hours and then heated in a water bath at about 70° C. for 20 hours to form cyano-containing polysiloxane. Then 20 mL of 8M HCl was added to the flask to hydrolyze the cyano groups into carboxylic acid groups. The hydrolysis was carried out at 70° C. for about 24 hours. Next, 50 mL of water was added to the flask to dissolve HCl and $NH_4Cl$ trapped inside of the carboxylated polysiloxane. The water was allowed to stay on the top of the viscous product for 6 hours. The water with HCl and $NH_4Cl$ was decanted, and 50 mL of water was added to the flask again. This step was repeated several times until the pH value of the decanted water was about 7. Then, 100 mL of acetone was added to the flask to dissolve the product. The acetone phase was separated from $NH_4Cl$ on the bottom of the flask, and then dried with anhydrous $Na_2SO_4$ overnight. Acetone was then evaporated at reduced pressure. The resultant product (H100PSI) was very viscous. The structure of H100PSI is shown in Formula 1 below:

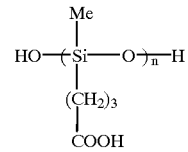

Formula 1

2. Preparation of a Carboxylated Polysiloxane Copolymer, HmPSI, with 14 mol % Carboxylated Groups, H14PSI.

First, 10 mL of dichlorodimethylsilane (Aldrich Company) and 2.13 mL of 3-cyanopropylmethyldichlorosilane (United Chemical Technologies, Inc.) were added to a flask and mixed under dry $N_2$ flow for 5 minutes. 2.2 mL of water was then added drop by drop to the flask to hydrolyze the silane mixture. Gaseous HCl evolved immediately after the addition of water. The mixture was stirred at room temperature for 4 hours and at 70° C. for another 20 hours. At this stage, the Si—Cl bonds of the silanes were effectively hydrolyzed and hydrolyzed moieties had condensed to form viscous cyano-containing siloxane copolymer. About 20 mL of 8M HCl was added to the flask to hydrolyze the cyano groups into carboxylic acid groups. The hydrolysis of cyano groups was carried out at 70° C. for 24 hours. Diethyl ether was added to the flask to extract the product. The ether solution of the product was washed with water to remove any HCl and $NH_4Cl$ trapped in the product. The solution was then dried with anhydrous $Na_2SO_4$. The evaporation of the ether at reduced pressure (Rotavapor) left a viscous carboxylated siloxane copolymer in the flask. Tile composition of 14 mol % carboxyl-containing polysiloxane, H14PSI, is represented by the following general formula (Formula 2).

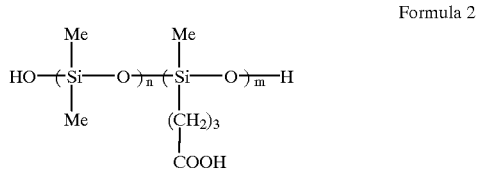

Formula 2

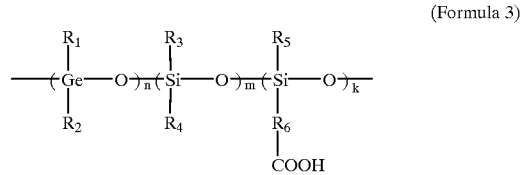

(Formula 3)

where n and m are the mole fractions such that n+m=1, n=0.86 and m=0.14 for H14PSI. The mole fractions n and m have a range under the formula m/(n+m) of from 0.14 to 0.999.

3. Preparation of a Carboxylated Polysiloxane Copolymer with 50 mol % Carboxylated Groups, H50PSI.

First, 10 mL of dichlorodimethylsilane (Aldrich Company) and 13.11 mL of 3-cyanopropylmethyldichlorosilane (United Chemical Technologies, Inc.) were added to a flask and mixed under dry $N_2$ flow for 5 minutes. 2.2 mL of water was then added drop by drop to the flask to hydrolyze the silane mixture. Gaseous HCl evolved immediately after the addition of water. The mixture was stirred at room temperature for 4 hours and at 70° C. for another 20 hours. At this stage, the Si—Cl bonds of the silanes were effectively hydrolyzed and hydrolyzed moieties had condensed to form viscous cyano-containing siloxane copolymer. About 20 mL of 8M HCl was added to the flask to hydrolyze the cyano groups into carboxylic acid groups. The hydrolysis of cyano groups was carried out at 70° C. for 24 hours. Diethyl ether was added to the flask to extract the product. The ether solution of the product was washed with water to remove any HCl and $NH_4Cl$ trapped in the product. The solution was then dried with anhydrous $Na_2SO_4$. The evaporation of the ether at reduced pressure (Rotavapor) left a viscous carboxylated siloxane copolymer in the flask. The composition of this 50 mol % carboxyl-containing polysiloxane, H50PSI, is represented the following general formula:

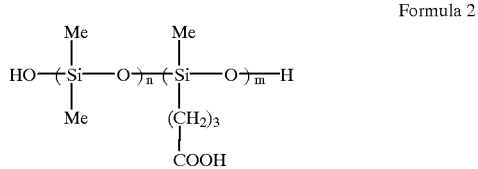

Formula 2 where n and m are the mole fractions such that n+m=1, n=0.50 and m=0.50 for H50PSI.

4. Preparation of Carboxylated Polygermanosiloxanes, CPGS

The carboxyl-containing polygermanosiloxanes or CPGSs used as precursors in the invention have the general Formula 3 (see below) in which $R_1$–$R_5$ are alkyl groups such as methyl groups, $R_6$ is an alkyl radical such as $(CH_2)_3$ and n, m, and k are mole fractions such that n+m+k=1 with k/(n+m+k) ranging from 0.1 to 0.60.

The carboxylated polygermanosiloxane, CPGS, involving methyl groups was synthesized as follows. First, a carboxylated siloxane, H100PSI, was synthesized as discussed in Preparation 1. A sample of the H100PSI (0.4657 g) was mixed with 20.0 mL $H_2O$ and 0.3966 g NaOH and kept in a capped glass bottle for 3 days at 70° C. The resultant solution was placed in a 125 mL flask at 25° C. and 80 mL of diethyl ether was added. Then 0.26 mL of dichlorodimethyl germane and, 2.1 mL of dichlorodimethylsilane were added to this mixture. The two phases were stirred for 3 hours at 25° C. with a reflux condenser in place. Then the ether phase was separated and dried with anhydrous sodium sulfate. Then the ether was evaporated from the ether solution at reduced pressure to yield a viscous fluid product. It was shown by infrared spectroscopy to contain silicon-oxygen-germanium (970 $cm^{-1}$) and silicon-oxygen-silicon (1000–1100 $cm^{-1}$) bonds, and carboxylate groups in the acid form (1712 $cm^{-1}$). From proton nuclear magnetic resonance (H-NMR) spectroscopy, the dimethyl germanium containing groups comprised 7.7 mol %, the dimethyl silicon containing groups comprised 68.8 mol %, and the methyl carboxypropyl silicon containing groups comprised 23.5 mol %. Thus, the composition of this CPGS is represented stoichiometrically, but not necessarily in terms of monomer sequence, by Formula 3, wherein all R groups are methyl and where n, m, k are the mole fractions such that n+m+k=1, and n=0.077, m=0.688 and k=0.235.

5. Preparation of Vinyl Containing Carboxylated Polygermanosiloxane, CVPGS.

A carboxylated polygermanosiloxane polymer containing vinyl groups was prepared as follows. First, 0.7343 g H100PSI, 0.6804 g NaOH and 10 mL of water were mixed together and kept in a capped bottle for 16 hours. The resultant solution was placed in a 125 mL flask. In another bottle, 0.83 mL of dimethyldichlorogermane, 0.47 mL of methylvinyldichlorosilane, and 1.58 mL of dimethyldichlorosilane were mixed together with 60 mL of diethyl ether. Then, the mixture also was added to the flask. The two phases were stirred for 4 hours at 25° C. The diethyl ether phase was separated and dried with anhydrous sodium sulfate. Then, the ether was evaporated from the ether solution at reduced pressure to yield a carboxyl and vinyl containing polygermanosiloxane in which about 14 mol % of the groups contained carboxylic acid containing substituents, 10 mol % had vinyl containing substituents, and about 20 mol % of the groups contained germanium. The general Formula 4 applies to this material, with $R_1$ through $R_6$ being methyl groups and $R_7$ being vinyl in this case. Generally, the groups are alkyl and/or alkene, and the in-chain units can be randomly arranged along the chain.

(Formula 4)

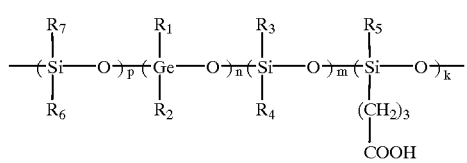

6. Preparation of Carboxyl-Containing Germanium Sesquioxide Siloxane Copolymer, or CGSS.

Carboxyl-containing germanium sesquioxide copolymers used as precursors in the invention have the following general Formula 5 (below) in which $R_1$ and $R_2$ can be alkyl groups, such as methyl groups, or alkene groups, such as vinyl groups, and $R_3$ is an alkyl or substituted fragment, such as $CH_2CH_2$, and n, a, b, c are mole fractions such that n+a+b+c=1 with n/(n+a+b+c) ranging from 0.01 to 0.33.

Formula 5

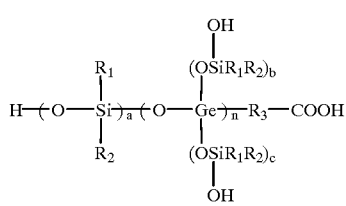

The preparation of a germanium sesquioxide siloxane copolymer (CGSS) was carried out as follows. In this preparation, 1.0065 g of carboxyethyl germanium sesquioxide (obtained from Gelest Inc, Tullytown Pa., Cat No GE C2100) was combined with 20.0 mL of water and 0.95 g of sodium hydroxide and allowed to react for 12 hours at 70° C. in a capped glass bottle. Then this product was cooled to 25° C. and placed in a 250 mL single neck round bottom flask with 50 mL of diethylether and 6.5 mL of dichlorodimethylsilane (Aldrich Chemical Co., Cat No. D6,082-6) and a reflux condenser was placed in the neck. This mixture was stirred for 3 hours at 25° C. Then the ether phase containing the product was dried with anhydrous sodium sulfate. This drying solid was separated from the ether phase. The ether was removed from the ether phase under reduced pressure. The resultant viscous product is believed to be represented by the general Formula 5.

The existence of the germnanium-oxygen-silicon (970 $cm^{-1}$) silicon-oxygen-silicon (1000–1100 $cm^{-1}$) and carboxylate groups (1712 $cm^{-1}$) as well as the features expected from the formula, such as $CH_3$ on Si at 1260 $cm^{-1}$, was shown by infrared spectroscopy. The H-NMR spectrum of the product was obtained and interpreted to show that n/(a+b+c) is 7.5/92.5 or 0.081 for this example.

7. Preparation of a Carboxyl and Vinyl Containing Germanium Sesquioxide Polygermanosiloxane (CVGSS) Copolymer A CVGSS material was obtained by by first combining 1.5067 g carboxyethyl germanium sesquioxide, 1.4217 g of NaOH and 20 mL of water in a glass bottle. The bottle then was capped and put into an oven at 70° C. for 16 hours. The solution in the bottle was transferred to a 125 mL round bottom flask, and then 50 mL of diethyl ether was added to the top of the solution in the flask. It was a two phase system. Then, 1.55 mL of methylvinyldichlorosilane and 4.67 mL of dimethyldichlorosilane were added slowly to the diethyl ether phase in the flask. The water phase was stirred gently so that the two silanes in the diethyl ether phase could react at the interface with the germanium sesquioxide reaction product in the water phase to form the carboxyl and vinyl containing polygermanosiloxane. The product in the diethyl ether phase was transferred to another flask and the solution was dried with anhydrous sodium sulfate. The polygermanosiloxane in which about 15 mol % of the units contained carboxyl groups and 20 mol % contained vinyl groups was achieved after the solvent was removed under vacuum. The CVGSS polymers can be represented by general Formula 6, in which, for this example, $R_1$ and $R_2$ are methyl, $R_3$ is $C_2H_4$, and $R_4$ is vinyl ($CHCH_2$), and n/(n+a+b+c+d+e+f) is 0.15, (d+e+f)/(n+a+b+c+d+e+f) is 0.2 and (a+b+c)/(n+a+b+c+d+e+f) is 0.65.

Formula 6

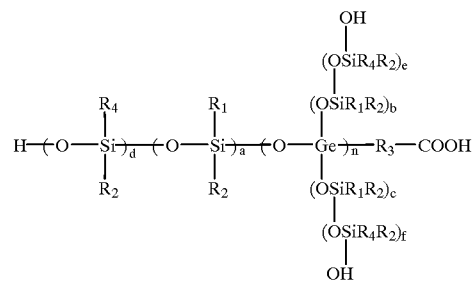

8. Preparation of a Carboxyl and Vinyl Containing Polygermanosiloxane (CVGSS) Copolymer Another CVGSS material represented by the general Formula 6 was obtained by first combining 1.4967 g carboxyethyl germanium sesquioxide, 1.42 g of NaOH and 20 mL of water in a glass bottle. The bottle then was capped and put into an oven at 70° C. for 16 hours. The solution in the bottle was transferred to a 125 mL round bottom flask, and then 50 mL of diethyl ether was added to the top of the solution in the flask. It was a two phase system. Then, 2.30 mL of methylvinyldichlorosilane and 3.90 mL of dimethyldichlorosilane were added slowly to the diethyl ether phase in the flask. The water phase was stirred gently so that the two silanes in the diethyl ether phase could react at the interface with the germanium sesquioxide reaction product in the water phase to form the carboxyl and vinyl containing polygermanosiloxane. The product in the diethyl ether phase was transferred to another flask and the solution was dried with anhydrous sodium sulfate. The polygermanosiloxane in which about 15 mol % of the units contained carboxyl groups and 30 mol % contained vinyl groups was achieved after the solvent was removed under vacuum.

9. Preparation of a Germanium Ester of a Carboxylated Polysiloxane, or GEPSI.

The germanium esters of carboxylated polysiloxane used as precursors in the invention have the following general Formula 7 in which $R_1$–$R_5$ are alkyl or alkene groups, such as methyl groups, and $R_6$ is an alkyl or substituted alkyl fragment, such as $CH_2CH_2$, X is H or C (from another carboxylate group), and n, m and k are mole fractions such that n+m+k=1 with m/(m+k) ranging from 0.10 to 0.80 and n/(n+m+k) ranging from 0.10 to 0.90

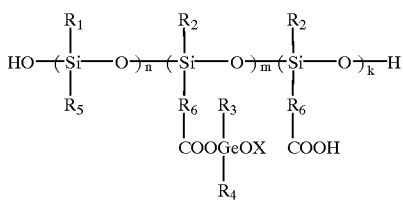

Formula 7

The preparation of an approximately 20 mol % germanium ester of H100PSI, was carried out as follows. First, 0.4525 g of H100PSI was dissolved in 10.0 mL of ethanol. Also, 0.0759 g of tetrameric dimethylgermanium oxide (which was synthesized from dichlorodimethylgermane (Gelest, Inc) according to method described by Rochow (M. P. Brown and E. G. Rochow, J. Am. Chem. Soc., 82, 4166(1960)) was dissolved in 1.0 mL of water at room temperature for 4 hours. The two solutions were mixed in a 20 mL bottle. The mixture in the uncapped bottle was then held in a drying oven at 70° C. for 12 hours to evaporate the ethanol and water. The product in the bottle then was dried in a vacuum oven at 60° C. for 4 hours. The product can be shown in one representation as given by Formula 7, where all R groups are methyl and X can be H, Ge, Si or C. It appears that X initially and for sometime (about 1 week or more, depending on temperature and other conditions) is H primarily. However, since the viscosity of the product increases gradually with time, it appears that condensation occurs between these OH groups and other carboxylates or Si—OH end groups to form larger molecules. Thus, a range of viscosities and products can be obtained by controlled aging of the initial product.

The infrared spectrum of the initial product shows the germanium ester form (1688 cm$^{-1}$) in addition to the expected features of H100PSI. The germanium to silicon mole ratio overall is 0.21, or about 0.2 or 2 to 10. Thus, about 20% of the Si units in H 100 PSI have been formed into germanium ester form.

10. Preparation of a Germanium Ester of a Carboxylated Polysiloxane, or GEPSI

The preparation of another germanium ester of H100PSI, also corresponding to formula 7, was carried out by the method given in preparation 9 (above) but with the following amounts of reactants. First, 0.1291 g of tetrameric germanium oxide was dissolved in 1 mL of water. Then, 0.2384 g of H100PSI was dissolved in 10 mL of ethanol. The two solutions were mixed together and the product was dried in an oven at 70° C. overnight. The germanium to silicon mole ratio is about 6.7 to 10. About 67% of the Si containing units in H100PSI have been formed into germanium ester form.

B. Formation of Microlenses and Optical Filters From the Carboxylated Polysiloxane Precursor Compositions The carboxylated polysiloxanes precursor compositions are dissolved in various solvents such as ethanol or acetone, preferably ethanol. The solvent is added to the polymer to the point that the polymer solution in fluid form is transferable as a droplet to a substrate and stays as a droplet before the solvent is evaporated. For example, a wire can be used to pick up a droplet on its tip from the concentrated solution of the polymer, and the droplet is deposited on a substrate (such as glass) by touching the tip of the wire with the polymer droplet. See FIG. 4. The precursor droplet is allowed to stay on the substrate for 30 to 60 minutes for the evaporation of solvent and for itself to flow and change into spherical shape. The spherical shaped droplet on the substrate is then heated in an oven in air up to 600° C. for oxidation of the polymer droplet into a inorganic glass lense on the substrate.

Preferably, the spherical shaped precursor droplet is about 0.4 mm in diameter and contains a volume of $2\times10^{-4}$ to $4\times10^{-4}$ mL.

In addition, the carboxylated polysiloxane precursor compositions (including polygermanosiloxanes) are mixed with metal acetylacetonate to form metal doped polysiloxanes and polygermanosiloxanes. The metal acetylacetonate used in the ion exchange can easily decompose into metal oxide under oxygen because acetylacetone molecules can be oxidized into carbon dioxide and water. The allowed concentration of metal ion in the carboxylated polysiloxanes and polygermanosiloxanes depends on the solubility of metal doped polymers because high concentration of metal ion in the polymer system results in insolubililty of the material and therefore results in the inability of forming spherical droplets from the materials. The metal doped polysiloxanes and polygermanosiloxanes are used to from droplets by the method mentioned above and the droplets are heated in an oven in air to form metal doped silicate or germanosilicate microlenses.

The method of forming a pattern of metal doped microlens on a substrate comprises the steps of: a) preparing a carboxylated silicone precursor composition; b) depositing the carboxylated silicone precursor composition on the surface of a substrate to form a precursor film; c) masking the precursor film with a mask having a desired pattern of spherical shape droplets; d) exposing the masked precursor film to radiation thereby cross-linking the unmasked precursor film to form a pattern of spherical shaped droplets; e) washing the precursor film with an organic solvent to remove the uncross-linked precursor film from the substrate and leaving the cross-linked precursor film on the substrate in the form of a pattern of spherical shaped droplets; f) applying a metal organic composition to the cross-linked precursor film thereby forming by ion-exchange a pattern of metal doped precursor droplets; and g) thermally oxidizing the metal doped precursor droplets to form a pattern of a metal doped droplets on a substrate. The step of thermal oxidation may occur according to the time-temperature program comprising the steps of a) heating from 25° C. to 200° C. in about 5 minutes; b) heating at 200° C. for 40–50 minutes; c) heating from 200° C. to 250° C. in about 1.5 minutes and at 250° C. for 30–60 minutes; d) heating from 250° C. to 500° C. in about 6.5 minutes and 500° C. for 60–210 minutes; e) heating from 500° C. to 550° C. in about 1.5 minutes and at 550° C. for 25–50 minutes; f) heating from 550° C. to 600° C. in about 1.5 minutes and 600° C. for 60–140 minutes; and g) cooling to 25° C. over a period of 30–60 minutes.

The precursor composition can be applied to a substrate surface by vapor deposition, or dropping or propelling it from some distance from the surface, as by an ink jet printer.

Another method of forming spherical droplet is to photocross-link a polymer film with photoinitiator on a substrate through a mask with a desired pattern such as a pattern of spherical shaped droplets, and to wash away uncross-linked polymer material. The insoluble and spherical droplets are thermally oxidized into silica or germanosilicate microlenses, or are ion exchanged first with metal ion and then thermally oxidized into metal doped silicate or gernanosilicate microlenses.

Preferably, the microlens has a spherical radius of from about 0.1 mm to about 60 mm. The microlens has a preferred diameter of 20 micrometers to 1 millimeter and a preferred height of from 0.5 micrometers to about 20 micrometers.

The production of vitreous microlenses and optical filters from various polysiloxane precursor compositions are more particularly shown below in the following examples. However, the examples are illustrative only and are not to be construed as limiting the invention which is described above and properly delineated in the claims.

EXAMPLE 1

A solution of H100PSI (Formula 1) in ethanol (approximately 0.10 gin 0.2 mL) was prepared. A droplet was picked up on the tip of a thin wire and transferred to a flat borosilicate (Asahi Glass Co. type AN-FP lot no. 891124) glass substrate. The wire was about 0.42 mm in diameter, the droplet was about 0.4 mm in diameter and $2 \times 10^{-4}$ mL in volume. Other droplets were picked up and placed on the glass substrate. Thus a range of droplet sizes was employed from about $5 \times 10^{-5}$ to $4 \times 10^{-4}$ mL. This was controlled physically by the time allowed for the solution to flow from the wire to the substrate.

The substrate with the droplets on it was heated in a tube furnace in air according to the schedule (1) 25° C. to 200° C. in about 5 min; (2) 200° C. for 45 min; (3) 250° C. for 60 min; (4) 500° C. for 100 min; (5) 555° C. for 50 min; and (6) 600° C. for 120 min. After this treatment, the furnace was turned off and it and the sample was cooled to 25° C. over a period of about 60 min.

The resultant microlens array was moved to a Dektak surface profile measuring machine and the shapes of a number of the microlenses produced in this manner were measured. They were shown to be smooth rounded lenses (little or no surface irregularities on a scale in which the output line width corresponds to less than $0.1\mu$ in the lens thickness). The lenses measured had the diameter (for the circle of substrate surface covered), and height of lens above substrate surface, given by 1 and h in Table 1 below, where the units are microns (i.e. $1 \times 10^{-6}$ m). The value for R given, in mm (i.e. $1 \times 10^{-3}$ m), is the radius of the sphere of which the lens would be a segment. The Dektak profile of a microlens made in this manner is shown as FIG. 5a.

TABLE 1

| 1 | h | R |
|---|---|---|
| 400 $\mu$ | 6 $\mu$ | ~6.67 mm |
| 150 $\mu$ | 1.2 $\mu$ | 4.69 mm |
| 400 $\mu$ | 2 $\mu$ | 20.00 mm |
| 450 $\mu$ | 4 $\mu$ | 12.66 mm |
| 350 $\mu$ | 2.5 $\mu$ | 12.25 mm |
| 250 $\mu$ | 1.4 $\mu$ | 11.16 mm |
| 600 $\mu$ | 8 $\mu$ | 11.25 mm |
| 300 $\mu$ | 2 $\mu$ | 11.25 mm |

EXAMPLE 2

Droplets of H14PSI in diethylether solutions containing Irgacure 184 were applied in the same manner as indicated in Example 1. The solution was about 0.1 g H14PSI and $5 \times 10^{-3}$ g Irgacure 184 in 0.3 mL of diethylether. The ether was allowed to evaporate for 10 min. and the substrate (borosilicate glass) with the H14PSI droplets was exposed to ultraviolet light in a Rayonet photochemical reactor with low pressure Hg lamps for 20 hours. The substrate was supported about 15 cm above the base and the fan was off.

Following this photolysis, the substrate containing the photocrosslinked droplets was suspended for 25 minutes in a beaker containing a 10 mL of ethanol solution of $Er(acac)_3$ with a concentration of 0.1 g of $Er(acac)_3$ in 100 mL of ethanol. Then, this was removed from the solution and rinsed gently with ethanol, and placed in a tube furnace and heated according to the following schedule: (1) 25° C. to 200° C. over 5 min. (2) 200° C. for 40 min; (3) 250° C. for 30 min; (4) 500° C. for 100 min; (5) 55° C. for 25 min; and (6) 600° C. for 140 min. Then the furnace and object were allowed to cool to 25° C. in about 30 min. The product was erbium silicate microlenses on the borosilicate substrate. The material resulting from fully exchanged H14PSI with $Er^{3+}$ oxidatively converts to glass with stoiclilometry $Er_2O_3 42SiO_2$. The lens structures formed with this application method as determined by Dektak measurement, were as follows:

TABLE 2

| 1 ($\mu$m) | h ($\mu$m) | R (mm) |
|---|---|---|
| 650 | 2.0 | 52.8 |
| 450 | 1.5 | 33.8 |

The units and definitions for 1, h and R are the same as those used in Example 1.

EXAMPLE 3

A film of H14PSI and a photoinitiator (5 wt % Irgaure 184) was placed on a borosilicate glass substrate. The film was formed by evaporation of a diethyl ether solution of H14PSI and was approximately 10 microns thick and contained 5 wt % Irgacure 184. A metal mask was suspended 25 microns above the film. The mask was constructed of 25 micron thick stainless steel with small holes in it. The holes ranged in size from 200 microns to 800 microns in diameter. This assembly was placed in the path of an ultraviolet lamp so that the light could shine through the holes onto the film.

After the photolysis was complete, the film was washed with diethyl ether to remove the soluble polymer. This left the insolubilized photolyzed material in regions. This assembly (substrate and insolubilized regions) was placed in a beaker containing a solution of $Tm(acac)_3 \cdot xH_2O$ in ethyl alcohol (0.0716 grams in 100 mL) for 25 minutes. It then was washed with ethyl alcohol, air dried and heated. The heating was done according to the schedule (1) 25° C. to 200° C. over 5 minutes; (2) 200° C. for 30 minutes; (3) 250° C. for 45 minutes; (4) 500° C. for 60 minutes; (5) 550° C. for 45 minutes, and (6) 600° C. for 60 minutes.

EXAMPLE 4

A solution of H50PSI (Formula 2) in ethanol (approximately 0.10 g in 0.2 mL) was prepared. A droplet was picked up on the tip of a thin wire and transferred to a flat borosilicate (Asahi Glass Co. type AN-FP lot no. 891124) glass substrate. The wire was about 0.42 mm in diameter, the droplet was about 0.4 mm in diameter and $2 \times 10^{-4}$ mL in volume. Other droplets were picked up and placed on the glass substrate. Thus a range of droplet sizes was employed from about $5 \times 10^{-5}$ to $4 \times 10^{-4}$ mL. This was controlled physically by the time allowed for the solution to flow from the wire to the substrate.

The substrate with the droplets on it was heated in a tube furnace in air according to the schedule (1) 25° C. to 200° C. in about 5 min; (2) 200° C. for 45 min; (3) 250° C. for 60 min; (4) 500° C. for 100 min; (5) 555° C. for 50 min; and (6) 600° C. for 120 min. After this treatment, the furnace was turned off and it and the sample was cooled to 25° C. over a period of about 60 min.

The resultant microlens array was moved to a Dektak surface profile measuring machine and the shapes of a number of the microlenses produced in this manner were measured. They were shown to be smooth rounded lenses (little or no surface irregularities on a scale in which the output line width corresponds to less than $0.1\mu$ in the lens thickness). The lenses measured had the diameter (for the circle of substrate surface covered), and height of lens above substrate surface, given by 1 and h in Table 3 below, where the units are microns (i.e. $1\times10^{-6}$ m). The value for R given, in mm (i.e. $1\times10^{-3}$ m), is the radius of the sphere of which the lens would be a segment. The Dektak profile of a microlens made in this manner is shown as FIG. 5b.

TABLE 3

| 1 ($\mu$m) | h ($\mu$m) | R (mm) |
|---|---|---|
| 450 | 47 | 54 |
| 350 | 30 | 10.3 |
| 250 | 2.0 | 7.8 |
| 150 | 1.5 | 1.9 |
| 400 | 2.5 | 8.0 |
| 350 | 2.5 | 6.1 |
| 400 | 5.6 | 3.6 |

EXAMPLE 5

A solution was prepared by mixing 0.2482 g of H100PSI with 10.4 mL of an Er(acac)$_3$ solution whose concentration was 0.1010 g Er(acac)$_3$ per 100 mL of absolute ethanol. This mixture was placed in a 20 mL capped bottle and stirred for 1 hour to achieve dissolution. About 3 mL of this solution was removed and placed in an uncapped 20 mL beaker, which was allowed to stand open (with a piece of filter paper to prevent dust) for about two hours until enough solvent had evaporated to lower the volume to 0.3 mL. The resultant clear fluid was applied to a borosilicate glass substrate by transferring droplets by touching the fluid with a thin (0.4 mm diameter) wire and then touching the droplet onto the substrate. This was done with a range of droplet sizes. The substrate and the array of droplets were heated in air in a tube furnace according to the following schedule: (1) 25° C. to 200° C. over 5 minutes; (2) 200° C. for 45 minutes; (3) 250° C. for 30 minutes; (4) 500° C. for 210 minutes; (5) 550° C. for 35 minutes; and (6) 600° C. for 90 minutes.

The lens structures formed with this application method, as determined by Dektak measurement, were as follows:

TABLE 4

| 1 ($\mu$m) | h ($\mu$m) | R (mm) |
|---|---|---|
| 500 | 9.0 | 6.95 |
| 400 | 13.5 | 2.97 |
| 200 | 4.2 | 2.38 |
| 225 | 7.0 | 1.81 |
| 200 | 6.5 | 1.54 |

EXAMPLE 6

Example 5 was repeated except that the application was done to make a line of solution, rather than circular droplet. Thus, lines (mounds in the shape of lines) on a borosilicate glass substrate were made the same way, with breadth (b) and height (h) as shown below;

TABLE 5

| b ($\mu$m) | h ($\mu$m) |
|---|---|
| 50 | 0.8 |
| 75 | 2.1 |

EXAMPLE 7

A solution was prepared by mixing 0.2482 g of H100PSI with 10.4 mL of an Tm(acac)$_3$ solution whose concentration was 0.1010 g Tm(acac)$_3$ per 100 mL of absolute ethanol. This mixture was placed in a 20 mL capped bottle and stirred for 1 hour to achieve dissolution. About 3 mL of this solution was removed and placed in an uncapped 20 mL beaker, which was allowed to stand open (with a piece of filter paper to prevent dust) for about two hours until enough solvent had evaporated to lower the volume to 0.3 mL. The resultant clear fluid was applied to a borosilicate glass substrate by transferring droplets by touching the fluid with a thin (0.4 mm diameter) wire and then touching the droplet onto the substrate. This was done with a range of droplet sizes. The substrate and the array of droplets were heated in air in a tube furnace according to the following schedule: (1) 25° C. to 200° C. over 5 minutes; (2) 200° C. for 45 minutes; (3) 250° C. for 30 minutes; (4) 500° C. for 210 minutes; (5) 550° C. for 35 minutes; and (6) 600° C. for 90 minutes.

The Dektak profile of a microlens made in this manner is shown in FIG. 5c. The lens structures formed with this application method, as determined by Dektak measurement, were as follows:

TABLE 6

| 1 ($\mu$m) | h ($\mu$m) | R (mm) |
|---|---|---|
| 400 | 7.5 | 2.7 |
| 700 | 16.0 | 3.8 |
| 500 | 10.2 | 3.1 |
| 650 | 15.5 | 3.4 |
| 625 | 15.0 | 3.3 |
| 550 | 14.5 | 2.6 |
| 400 | 9.8 | 2.0 |
| 450 | 9.7 | 2.6 |
| 400 | 8.5 | 2.4 |

Here the units and definitions for 1, h and R are the same as those used in Example 1.

The invention has been described with reference to the preferred embodiment. Obviously, modifications and alterations will occur to others upon a reading and understanding of the proceeding detailed description. It is intended that the invention be construed as including all such alterations and modifications insofar as they come within the scope of the claims or the equivalent thereof.

Having thus described the invention, it is claimed:

1. A method of producing a microlens on a substrate comprising the steps of:

a) preparing a carboxylated silicone precursor composition;

b) applying the carboxylated silicone precursor composition to a surface of a substrate to form a precursor droplet; and c) thermally oxidizing the precursor droplet to form a microlens, said silicone precursor composition selected from the group consisting of vinyl containing polygermanosiloxane

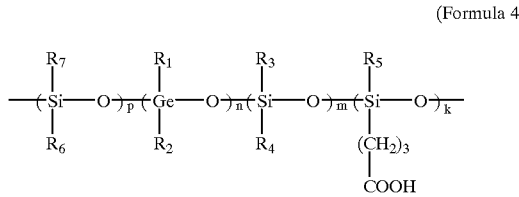

(Formula 4)

wherein $R_1$ through $R_6$ are selected from the group consisting of alkyl and alkene groups and $R_7$ is a vinyl group and carboxylated polygermanosiloxane

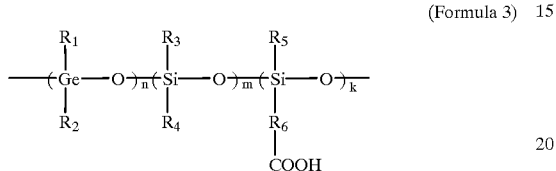

(Formula 3)

wherein $R_1$ through $R_5$ are alkyl groups and $R_6$ is an alkyl radical.

2. A method of producing a microlens on a substrate comprising the steps of:
   a) preparing a carboxylated silicone precursor composition;
   b) applying the carboxylated silicone precursor composition to a surface of a substrate to form a precursor droplet; and
   c) thermally oxidizing the precursor droplet to form a microlens, said silicone precursor composition selected from the group consisting of

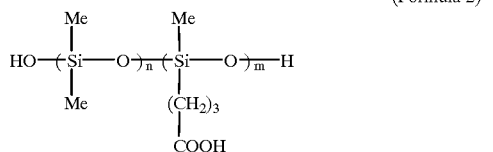

(Formula 2)

wherein $m/(n+m)$ is from 0.14 to 0.999.

3. A method of forming a microlens structure having a desired pattern on a substrate comprising the steps of:
   a) preparing a carboxylated silicone precursor composition;
   b) depositing the carboxylated silicone precursor composition on the surface of a substrate to form a precursor film;
   c) masking the precursor film with a mask having a desired pattern of spherical shaped droplets;
   d) exposing the masked precursor film to radiation thereby cross-linking the unmasked precursor film to form a pattern of spherical shaped droplets;
   e) washing the precursor film with an organic solvent to remove the uncross-linked precursor film from the substrate and leaving cross-linked precursor film in the form of a pattern on the substrate; and,
   f) thermally oxidizing the cross-linked precursor film to form a pattern of spherical shaped droplets on the substrate.

4. The method of claim 3 further comprising the step of adding a photoinitiator to the carboxylated silicone precursor composition prior to deposition.

5. The method of claim 3 wherein said carboxylated silicone precursor composition is selected from the group consisting of carboxylated polysiloxane, carboxylated polygermianosiloxane, carboxylated germanium sesquioxide siloxane copolymer, and germanium esters of carboxylated polysiloxane.

6. The method of claim 5 wherein said carboxylated polysiloxane is poly(carboxypropylmethyl) siloxane.

7. The method of claim 5 wherein said carboxylated polygermanosiloxane is selected from the group consisting of vinyl containing carboxylated polygermanosiloxane and carboxylated polygermanosiloxane.

8. The method of claim 5 wherein said carboxylated polysiloxane is

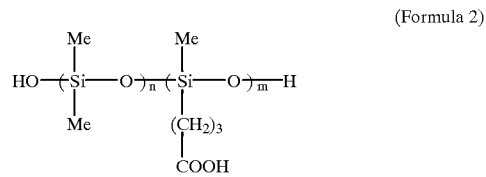

(Formula 2)

wherein $m/(n+m)$ is from 0.14 to 0.999.

9. The method of claim 5 wherein said germanium esters of carboxylated polysiloxanes are germanium esters of

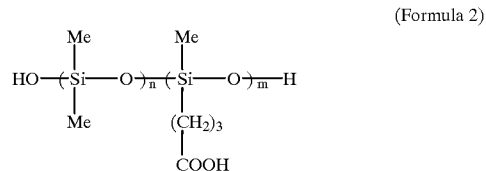

(Formula 2)

wherein $m/(n+m)$ is from 0.14 to 0.999.

10. The method of claim 3, wherein said substrate is selected from the group consisting of silica, silicate glass, and silicon.

11. The method of claims 10, wherein said substrate is a borosilicate glass.

12. A method of forming a pattern of metal doped microlens on a substrate comprising the steps of:
   a) preparing a carboxylated silicone precursor composition;
   b) depositing the carboxylated silicone precursor composition on the surface of a substrate to form a precursor film;
   c) masking the precursor film with a mask having a desired pattern of spherical shape droplets;
   d) exposing the masked precursor film to radiation thereby cross-linking the unmasked precursor film to form a pattern of spherical shaped droplets;
   e) washing the precursor film with an organic solvent to remove the uncross-linked precursor film from the substrate and leaving the cross-linked precursor film on the substrate in the form of a pattern of spherical shaped droplets;
   f) applying a metal organic composition to the cross-linked precursor film therby forming by ion-exchange a pattern of metal doped precursor droplets; and,
   e) thermally oxidizing the metal doped precursor droplets to form a pattern of a metal doped droplets on a substrate.

13. The method of claim 12, further comprising the step of adding a photoinitiator to the carboxylated silicone precursor composition prior to deposition.

14. The method of claim 12 wherein said carboxylated silicone composition is selected from the group consisting of carboxylated polysiloxane, carboxylated polygermanosiloxane, carboxylated germanium sesquioxide siloxane copolymer, and germanium esters of carboxylated polysiloxane.

15. The method of claim 14 wherein said carboxylated polysiloxane is selected from the group consisting of poly(carboxypropylmethyl) siloxane

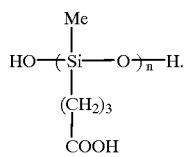

(Formula 1)

16. The method of claim 14, wherein said carboxylated polygermanosiloxane is selected from the group consisting of carboxylated polygermanosiloxane

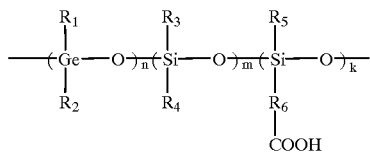

(Formula 3)

wherein $R_1$ through $R_5$ are alkyl groups and $R_6$ is an alkyl radical, and vinyl containing polygermanosiloxane

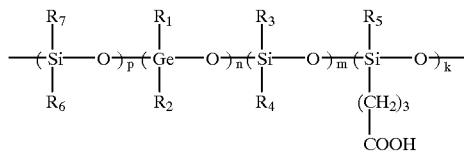

(Formula 4)

wherein $R_1$ through $R_6$ are selected from the group consisting of alkyl and alkyl and alkene groups and $R_7$ is a vinyl group.

17. The method of claim 14 wherein said carboxylated polysiloxane is

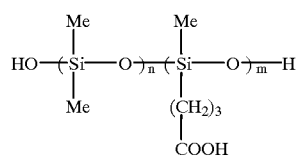

(Formula 2)

wherein $m/(n+m)$ is from 0.14 to 0.999.

18. The method of claim 14 wherein said germanium esters of carboxylated polysiloxane are germanium esters of

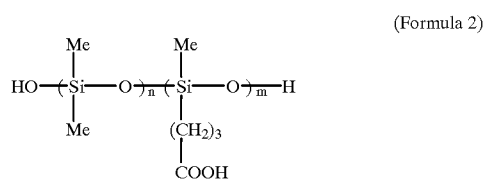

(Formula 2)

wherein $m/(n+m)$ is from 0.14 to 0.999.

19. The method of claim 12 wherein said substrate is selected from the group consisting of glass, silicon and silica oxide glasses.

20. The method of claim 19 wherein said substrate is a borosilicate glass.

21. The method of claim 12 wherein said thermal oxidization occurs according to a time-temperature program comprising the steps of:
 a) heating from 25° C. to 200° C. in about 5 min.;
 b) heating at 200° C. for 40–50 min.;
 c) heating from 200° C. to 250° C. in about 1.5 min. and at 250° C. for 30–60 min.;
 d) heating from 250° C. to 500° C. in about 6.5 min. and at 500° C. for 60–210 min.;
 e) heating from 500° C. to 550° C. in about 1.5 min. and at 550° C. for 25–50 min.;
 f) heating from 550° C. to 600° C. in about 1.5 min. and at 600° C. for 60–140 min.; and,
 g) cooling to 25° C. over a period of 30–60 min.

22. The method of claim 12 wherein said radiation is ultra-violet light.

23. The method of claim 12 wherein said metal organic composition comprises metal ions selected from the group consisting of alkali metals, transition metals and rare earth (lanthanide) metals.

* * * * *